United States Patent [19]
Hill et al.

[11] Patent Number: 5,633,123
[45] Date of Patent: May 27, 1997

[54] SYSTEM FOR ABLATIVE IMAGING BY PROXIMITY LITHOGRAPHY

[75] Inventors: Jeffrey B. Hill, Stillwater; Andrew J. Ouderkirk, Woodbury; Daniel P. Stubbs, May Township, Washington County; Robert S. Jackson, Little Canada; Douglas S. Dunn, Maplewood, all of Minn.

[73] Assignee: Minnesota Mining and Manufacturing Company, St. Paul, Minn.

[21] Appl. No.: 575,242

[22] Filed: Dec. 20, 1995

Related U.S. Application Data

[62] Division of Ser. No. 381,022, Jan. 31, 1995, Pat. No. 5,501,944, which is a continuation of Ser. No. 169,504, Dec. 17, 1993, abandoned.

[51] Int. Cl.$^6$ .................................................. B23K 26/16
[52] U.S. Cl. ............................. 430/347; 430/5; 430/945; 219/121.68; 250/504 R
[58] Field of Search .............................. 430/347, 945, 430/5; 250/504 R, 492.1; 219/121.68

[56] References Cited

U.S. PATENT DOCUMENTS

| | | | |
|---|---|---|---|
| 3,440,388 | 4/1969 | Otstot et al. | 219/69.1 |
| 3,832,547 | 8/1974 | Silverman | 250/319 |
| 3,945,318 | 3/1976 | Landsman | 101/467 |
| 4,032,743 | 6/1977 | Erbach et al. | 219/121.7 |
| 4,323,755 | 4/1982 | Nierenberg | 219/121.69 |
| 4,323,757 | 4/1982 | Oka et al. | 219/121.72 |
| 4,515,867 | 5/1985 | Bleacher et al. | 428/204 |
| 4,774,170 | 9/1988 | Pan et al. | 430/270.13 |
| 4,822,451 | 4/1989 | Ouderkirk et al. | 216/62 |
| 4,847,181 | 7/1989 | Shimokawa | 430/297 |
| 4,868,006 | 9/1989 | Yorkgitis et al. | 427/53.1 |
| 4,877,480 | 10/1989 | Das | 216/51 |
| 4,879,176 | 11/1989 | Ouderkirk et al. | 428/323 |
| 4,973,572 | 11/1990 | DeBoer | 503/227 |
| 5,061,604 | 10/1991 | Ouderkirk et al. | 430/296 |
| 5,156,938 | 10/1992 | Foley et al. | 430/200 |
| 5,171,650 | 12/1992 | Ellis et al. | 430/20 |
| 5,178,726 | 1/1993 | Yu et al. | 216/66 |
| 5,204,517 | 4/1993 | Cates et al. | 250/205 |
| 5,217,829 | 6/1993 | Nowak et al. | 430/5 |

(List continued on next page.)

FOREIGN PATENT DOCUMENTS

| | | |
|---|---|---|
| 2690862 | 11/1993 | France . |
| 2441263 | 3/1976 | Germany . |
| 2616362 | 11/1977 | Germany . |
| 61-262187 | 11/1986 | Japan . |
| WO90/01393 | 2/1990 | WIPO . |

OTHER PUBLICATIONS

"Excimer Laser Processing of Thin Metallic Films on Dielectric Substrates," Sowado et al., 801 *High Power Lasers*, pp. 163–167 (1987).

"Excimer Laser Thin Metallic Film Patterning on Polyvinyledene Difluoride," 129 *Materials Research Society Symposium Proceedings*, pp. 399–404 (1989).

"Excimer Laser Ablation of Polyimide in a Manufacturing Facility," 54 *Applied Physics A—Solids and Surfaces*, pp. 355–359 (1992).

*Primary Examiner*—John A. McPherson
*Attorney, Agent, or Firm*—Eric D. Levinson

[57] ABSTRACT

A system for prolonging the useful life of a mask while ablating a pattern into a workpiece. The system includes a workpiece, a debris-blocking layer thereon, a laser directed toward the workpiece, and a mask provided between the laser and debris-blocking layer. The workpiece may be a data storage disk comprising a substrate and a magnetic coating thereon. The laser may be an ultraviolet laser and the debris-blocking layer should be transparent to the light emitted by the laser. The pattern may include concentric or spiral optical servo tracks in the magnetic coating. The debris-blocking layer minimizes degradation of the mask, thereby minimizing the need to clean the mask and prolonging the useful life of the mask.

16 Claims, 6 Drawing Sheets

U.S. PATENT DOCUMENTS

| | | | |
|---|---|---|---|
| 5,229,247 | 7/1993 | McCarthy et al. | 430/253 |
| 5,254,393 | 10/1993 | Murschall et al. | 428/212 |
| 5,296,673 | 3/1994 | Smith | 219/121.68 |
| 5,339,737 | 8/1994 | Lewis et al. | 101/454 |
| 5,376,314 | 12/1994 | Share et al. | 264/25 |
| 5,379,698 | 1/1995 | Nowak et al. | 101/454 |
| 5,385,092 | 1/1995 | Lewis et al. | 101/467 |

SYSTEM FOR ABLATIVE IMAGING BY PROXIMITY LITHOGRAPHY

This is a division of Application No. 08/381,022 filed Jan. 31, 1995, now U.S. Pat. No. 5,501,944, which is a continuation of Application No. 08/169,504 filed Dec. 17, 1993, now abandoned.

BACKGROUND OF THE INVENTION

The present invention generally relates to a method of forming a shaped image in a workpiece. More specifically, the present invention relates to a method of forming a shaped image in a workpiece using a high energy source and a layer disposed proximate the workpiece such that the layer prevents debris from the workpiece from dispersing away from the workpiece.

Techniques for forming a shaped image in a workpiece are many. Such techniques are widely used in the manufacture of many types of electronic devices such as magnetic data storage disks with optical servo tracks, memory card circuits, and flexible circuits. Related techniques are also employed to mark various devices with information such as bar-codes, to create printing elements, such as lithographic plates, and to generate ornamental designs.

Stumping is one technique for creating a shaped image in a workpiece. For example, presses with stamping dies create optically readable servo stitches in magnetic data storage disks. One problem with the stamping technique is that stamping dies have relatively short life spans. Also, the elastic nature of the disks causes changes in the geometry of stamped stitches over time.

Chemical etching is another example of a technique for creating a shaped image in a workpiece. In this technique, photoresist is applied to a substrate and patterned in a known manner. Developed portions of the resist are then removed by chemical etching to leave the shaped image. The chemicals which perform the etch are not entirely beneficial. For instance, the chemicals tend to undercut undeveloped portions of the workpiece. This undercutting limits the size and location of the shaped image which may be formed in the workpiece.

Other well-known processes for creating a shaped image in a workpiece include electron-beam, ion beam, corona, and plasma treatment. These methods are either continuous or long pulse length etching processes which, due to their low energy flux, yield a low heat transfer rate. The low heat transfer rates are detrimental when etching surface coatings such as polymer-based coatings. Specifically, the low heat transfer rates create an undesirable thermal treatment effect in areas of the coating other than the etched areas.

Laser-based techniques are also useful for creating a shaped image in a workpiece. One technique utilizes an Argon/Ion laser to directly burn optically-readable servo stitches one by one into a magnetic data storage disk. The laser beam is optically switched on and off while the disk is spinning and a final lens objective is translated. U.S. Pat. No. 4,323,755 to Nierenberg concerns a method of producing a machine readable coded marking in a surface of a workpiece, such as a glass faceplate panel of a television picture tube, by vaporizing parallel areas of similar width in the panel surface using a $CO_2$ laser. U.S. Pat. No. 4,515,867 to Bleacher et al. illustrates a technique for directly marking a glass funnel of a television picture tube by ablating image features into a pigmented inorganic coating placed on the funnel. U. Sowado, H. J. Kahlert & D. Basting, in "Excimer Laser Processing of Thin Metallic Films On Dielectric Substrates," 801 *High Power Lasers* 163–167 (1987), comment upon patterning metal coatings of polymer substrates using ablation.

U.S. Pat. No. 5,204,517 to Cates et al. discloses a method of removing paint coatings from metal and polymer substrates using an excimer laser. The laser has a relatively long pulse width on the order of 0.2 microseconds during which the energy density is in the range of 1–5 $J/cm^2$. The method involves control of a paint removal process by monitoring spectral emissions of the paint coating.

U.S. Pat. No. 5,061,604 to Ouderkirk et al. describes irradiation of a surface layer of semi-crystalline polymer with an excimer laser to create an imagewise distribution of quasi-amorphous polymer within the surface layer has been mentioned. A reactive ion etching process is then utilized to preferentially remove the semi-crystalline polymer after irradiation of the surface layer.

U.S. Pat. No. 4,822,451 to Ouderkirk et at., U.S. Pat. No. 4,868,006 to Yorkgitis et al., and U.S. Pat. No. 4,879,176 to Ouderkirk et al. also concern irradiation of a surface layer of semi-crystalline polymer with an excimer laser to render portions of the surface layer quasi-amorphous. It has been noted that the presence of the quasi-amorphous layer tends to enhance bonding of the semi-crystalline polymer to other materials generally, including adhesive materials. It has also been noted that the presence of the quasi-amorphous layer reduces optical reflectance and increases optical transmission of the semi-crystalline polymer, increases coating adhesion to the semi-crystalline polymer, and reduces the coefficient of friction of the surface of the semi-crystalline polymer.

Such direct laser formation of individual shaped image features may be desirable for some workpieces with small numbers of image features and for some projects with relatively small numbers of workpieces. However, direct laser formation of individual features is not entirely without problems. For example, ablation typically yields high energy fragments of debris which often splash onto optical equipment associated with the laser. Cleaning the debris fragments from the optical equipment is disruptive and impractical in industrial applications.

One potential solution to the debris problem involves moving the final optical surfaces some added distance away from the workpiece. However, this solution is undesirable for a variety of reasons. For instance, laser beam control and orientation relative to the workpiece is more technically challenging and less economically efficient when the optical surfaces are moved further from the workpiece. Additionally, space considerations sometimes prevent movement of the optical surfaces away from the workpiece.

U.S. Pat. No. 4,032,743 to Erbach et al. discloses a rotating cylindrical drum and a plurality of stationary lasers for boring closely spaced holes through foil strips mounted on the drum using a single pulse of a laser for each hole. A strip of film is connected to fixed-rate supply and take-up reels and is positioned between the foil and a lens of the laser to protect the lens from vaporized material. The film is transparent to the radiation wavelength of the laser.

Another consideration is that, though direct formation of individual image features is sometimes beneficial for workpieces with fewer image features and for smaller batches of workpieces, direct feature formation is not always an optimum choice. For example, direct laser formation of image features, one at a time, requires much more time than if the laser operated on multiple images or image features arranged about the workpiece.

Technological advances have been developed which allow laser operation on more than one image or image feature at a time. For example, U.S. Pat. No. 4,877,480 to Das discloses a contact lithographic technique for forming shaped images in a workpiece, such as an alumina-coated ceramic substrate. According to Das, a mask of material that is highly reflective in the wavelengths of the selected laser is placed in contact with the alumina coating. Radiation from a $CO_2$ laser is applied to the mask to remove portions of the alumina coating which are not masked. The reflective surface of the mask reflects the laser radiation away from areas of the workpiece covered by the mask.

M. Gauthier, R. Bourret, E. Adler, & Cheng-Kuei Jen, in "Excimer Laser Thin Metallic film Patterning On Polyvinyledene Difluoride," 129 *Materials Research Society Symposium Proceedings*, 399–404 (1989), discusses a technique for ablating metal coatings located on the front and back sides of a polymer film using an excimer laser and a mask to form patterns in each of the metal coatings. The laser first ablates a pattern in the coating on the front side in a single pulse. The laser then ablates a pattern in the coating on the rear side in a single pulse by passing radiation through the front side of the polymer film toward the coating on the rear side.

A mask which is placed in relation with a workpiece, as in the Das patent, may be a supported or an unsupported mask. An unsupported mask is a mask which does not include underlying mechanical support for transparent window portions of the mask which shape the areas to be removed from the workpiece. The use of unsupported masks may be disadvantageous for many reasons. For example, unsupported masks tend to absorb heat which may cause mask shape distortion. Also, due to the inability of an unsupported mask to support isolated areas of mask material, it is not possible to make certain image features, such as an X-Y pattern or the center of the letter "O", using an unsupported mask. It is also difficult under some manufacturing tolerance extremes to maintain an unsupported mask in intimate contact with the workpiece being imaged. This may impair resolution and create alignment problems.

A supported contact mask includes mechanical support for all areas of the mask and avoids many problems associated with unsupported masks. However, it has been found that even the use of a supported mask in combination with a laser is not entirely satisfactory for creating patterned images in workpieces. One major problem is fragment debris created by imaging processes, such as ablation. Specifically, debris often splashes onto the mask. Cleaning the mask after each use is not practical in industrial applications. Also, debris may cause spots in transparent window areas of the mask during the imaging process. Such spots cause diffraction of the laser beam and may prevent accurate image feature creation.

One potential solution to the debris problem is to move the mask away from the workpiece. In some applications, projection lithography incorporates a mask positioned away from the workpiece. J. R. Lankard & G. Wolbold, in "Excimer Laser Ablation of Polyimide in a Manufacturing Facility," 54 *Applied Physics A—Solids and Surfaces*, 355–359 (1987), discuss application of projection lithography in connection with laser ablation of polymer-coated substrates.

Projection lithography has a number of limitations, though, including high equipment costs and low laser beam throughput. Also, projection lithography may only expose small workpiece areas at a time. This small field size complicates imaging of large area, non-repeating shaped images since the mask must be repeatedly and precisely moved in relation to the imaged areas. Movement of the mask away from the workpiece may also decrease the resolution of image features in the workpiece and may cause image blooming between the mask pattern and the workpiece.

SUMMARY OF THE INVENTION

The present invention includes a method of creating a shaped image in a workpiece using a high energy source. The method comprises positioning a layer proximate the workpiece, such that the layer prevents debris from the workpiece from dispersing away from the workpiece, and directing radiation from the high energy source through the layer to the workpiece, the layer being substantially transparent to radiation emitted by the high energy source such that the high energy source is capable of forming the shaped image. The present invention also includes a method of preventing debris from the workpiece from dispersing away from the workpiece and a system for preventing debris from dispersing away from the workpiece.

DETAILED DESCRIPTION OF THE PREFERRED EMBODIMENTS

The present invention includes a method of forming a shaped image in a workpiece using a high energy source and a method of preventing debris from the workpiece from dispersing away from the workpiece. The present invention also includes a system for preventing debris from the workpiece from dispersing away from the workpiece and a kit for forming the shaped image in the workpiece using the high energy source.

Figure 1:
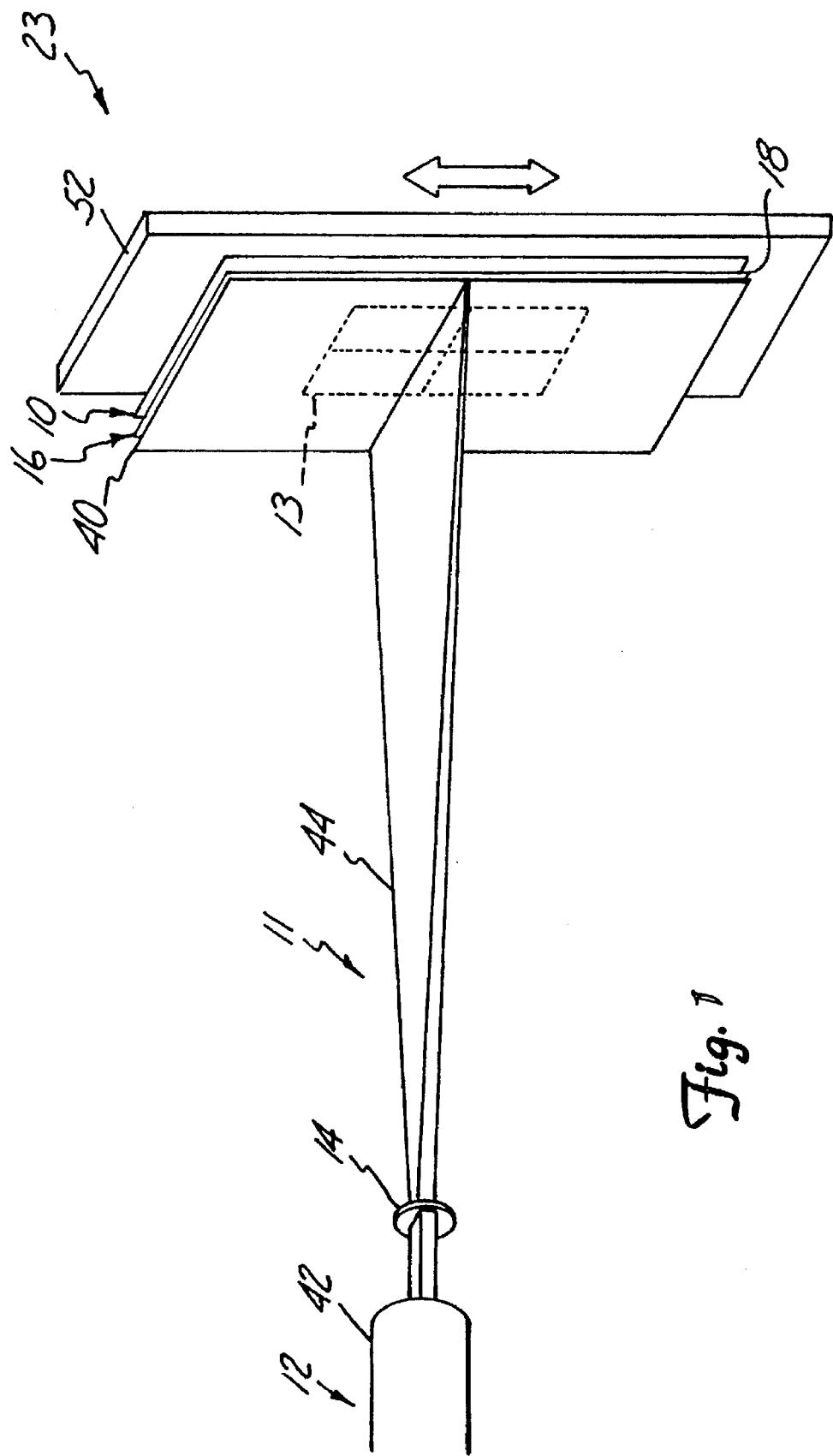
FIG. 1 is a perspective view of the system of the present invention.

In accordance with the method and system of the present invention, energy output 11 from a high energy source 12, as in a batch staging system 23 illustrated in FIG. 1, is directed toward a workpiece 10 to form a shaped image, such as a three dimensional pattern 13, in the workpiece 10. Any of a variety of optical elements 14, such as lenses and mirrors, may be positioned to adjust the energy output 11 of the high energy source 12.

Under certain conditions, the energy output 11 may force debris away from the workpiece 10. A buffer layer 16 is disposed proximate the workpiece 10 to prevent debris from dispersing away from the workpiece 10 and to prevent debris from contacting any final optical element (not shown)

located proximate the workpiece 10. The buffer layer 16 may also prevent debris from redepositing on areas of the workpiece 10 that are located adjacent the pattern 13 of the workpiece. (In FIG. 1, the buffer layer 16 is shown spaced away from the workpiece 10 for purposes of clarity only). Essentially, the buffer layer 16 is a debris blocking layer which acts as a physical barrier to movement of debris away from the pattern 13 and the workpiece 10. The buffer layer 16 is also useful for preventing contamination of "clean room" environments by trapping debris proximate the workpiece 10.

Figure 2:
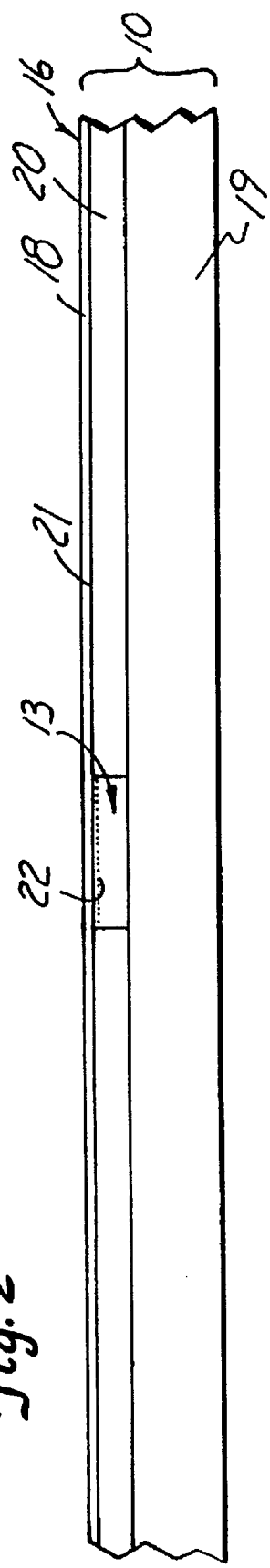
FIG. 2 is a side elevation view of one embodiment of the workpiece and buffer layer of the present invention.

Workpieces 10 of particular interest, as in FIG. 2, include a substrate 19. One or more sides of the substrate 19 may include a coating 20. If the substrate 19 does not include the coating 20, the substrate 19 includes a boundary portion (not shown) instead of the coating 20. The pattern 13 is preferably created in the coating 20, if the substrate 19 includes the coating 20, or in the boundary portion, if the substrate 19 does not include the coating 20.

The substrate 19 may be made of many organic or inorganic materials, including silicon, metal, or polymers, such as polyester, polycarbonate, polyethylene, polyamide, polyethylene terephthalate or polyimide. The boundary portion is made of the same material as the substrate. The coating includes a surface coating layer (not shown), and may include additional coating layers (not shown). The coating layers may be arranged in any desired order. The pattern 13 may be formed in any of the coating layers, as desired, so long as the desired coating layer is visible to a sufficient amount of the energy output 11 to form the pattern 13.

Organic and inorganic materials may be included in the coating layers to provide desired operative, structural, identifying, and aesthetic features. For instance, one or more of the coating layers may be made of a conductive metal to provide desired conductive characteristics. Examples of conductive metals of interest include copper, silver, nickel, chromium, and alloys of these, such as indium tin oxide. Also, one or more of the coating layers may be made of a magnetic compound to provide desired magnetic characteristics. The magnetic compound, for purposes of this disclosure, is an elemental metal or a metal compound that possesses magnetic properties. The magnetic compound may be the sole component of a particular coating layer or may be a single component of several components making up the particular coating layer, such as magnetic particles distributed within the particular coating layer. Examples of magnetic metals include iron, iron oxide, barium ferrite, cobalt nickel, cobalt phosphorous, cobalt chrome, and oxides of cobalt.

Examples of potential workpieces include substrates coated with magnetic metal or magnetic material, such as a magnetic data storage disk, sometimes referred to as a floppy disk. In one embodiment, the pattern 13 takes the form of a servo path, such as a spiral track, of the magnetic storage disk. In another embodiment, the pattern 13, namely the servo path, includes a plurality of concentric optical servo tracks formed in the magnetic storage disk. Other examples of potential workpieces include substrates coated with conductive metal, such as memory card circuits and touch screen circuits. Additional examples of potential workpieces include polymer-coated substrates, such as objects on which bar code information is placed.

Preferably, the energy output 11, as in FIG. 1, has both high energy density, high energy per unit area, high fluence, and high energy density per pulse, to assure satisfactory imaging. Other variables affecting high energy source selection include substrate characteristics, coating characteristics, and pattern characteristics, such as pattern line width and spacing, overall pattern size, and pattern depth. Potential high energy sources include monochromatic devices such as lasers and short pulse length, broadband sources such as surface discharge mechanisms and flashlamps.

In one embodiment (not shown), the buffer layer 16 comprises the substrate 19 of the workpiece 10. A coated side (not shown) of the substrate 19 includes the coating 20. The substrate also includes a non-coated side (not shown). The coated and non-coated sides oppose each other. In this embodiment, the high energy source 12 is located on the non-coated side of the substrate 19. The energy output 11 of the high energy source 12 enters the non-coated side of the substrate 19 and passes through the substrate 19. The energy output 11 contacts the coating 20 on a side (not shown) of the coating 20 that is in contact with the substrate 19 and creates the pattern 13 in the coating 20 of the workpiece 10.

In more preferred embodiments, the buffer layer 16 is either a web of film (not shown) or, as in FIG. 1, a sheet of film 18 positioned to isolate the workpiece 10. All comments about the buffer layer 16 apply to the sheet of film 18, the web of film, and the substrate (when the substrate is the buffer layer 16), unless otherwise indicated. The buffer layer 16 is durable enough to provide adequate handling characteristics and strong enough to prevent passage of debris liberated from the workpiece 10.

The high energy source 12 and the buffer layer 16 are preferably selected to assure optimum image shaping in the coating or the boundary portion (not shown) of the workpiece 10 and to assure efficient use of the energy output 11. The energy output 11 required at the coating or the boundary portion depends on the wavelength distribution of the energy output 11 and on workpiece characteristics, including characteristics of the substrate, the coating and the pattern 13 to be formed. The wavelength distribution and workpiece characteristics, substantially determine the absorption characteristics of the coating or the boundary portion, and thus the ablation results.

The energy output 11 actually reaching the coating or the boundary portion depends on the transmittance of the energy output 11 through the buffer layer 16. A higher transmittance through the buffer layer 16 decreases the required input energy to the high energy source 12 and decreases absorptive heating of the buffer layer 16. The transmittance of the buffer layer 16 is highly dependent upon the material the buffer layer 16 is made of and the thickness of the buffer layer 16.

The buffer layer 16 is sufficiently transparent to the energy output 11 of the high energy source 12 such that the energy output 11, after passing through the buffer layer 16, has sufficient remaining energy to form the pattern 13 in the coating or the boundary portion of the workpiece 10. The buffer layer 16 is preferably highly transparent to the energy output 11 such that the high energy source 12 efficiently develops the pattern 13 in the coating or the boundary portion. Preferably, the buffer layer 16 is sufficiently transparent to the energy output 11 to allow at least about fifty percent (50%), and more preferably at least about eighty percent (80%), of the energy output 11 to pass through the buffer layer 16.

The high energy source 12 and the buffer layer 16 are preferably selected to assure optimum image shaping in the coating or the boundary portion. Image shaping depends on the geometric changes in the energy output 11, such as scattering and diffraction of the output 11, due to passage of the output 11 through the buffer layer 16. The geometric changes in the energy output 11 are created by buffer layer 16 manufacturing defects, such as extrusion lines, surface irregularities and caliper nonuniformity. Preferably, the buffer layer 16 has minimal manufacturing defects and is of sufficient quality to produce desirable image resolution in the coating or the boundary portion.

The transmittance of the buffer layer 16 and the geometric changes imposed upon the energy output 11 depend upon the material the buffer layer 16 is made of, the thickness of the buffer layer 16, and manufacturing defects present in the buffer layer 16. It has been discovered that some organic polymer films, such as particular grades of polypropylene film, are particularly conducive to optimum image shaping and efficient use of energy output 11 from the high energy source 12, under certain circumstances.

Figure 3:
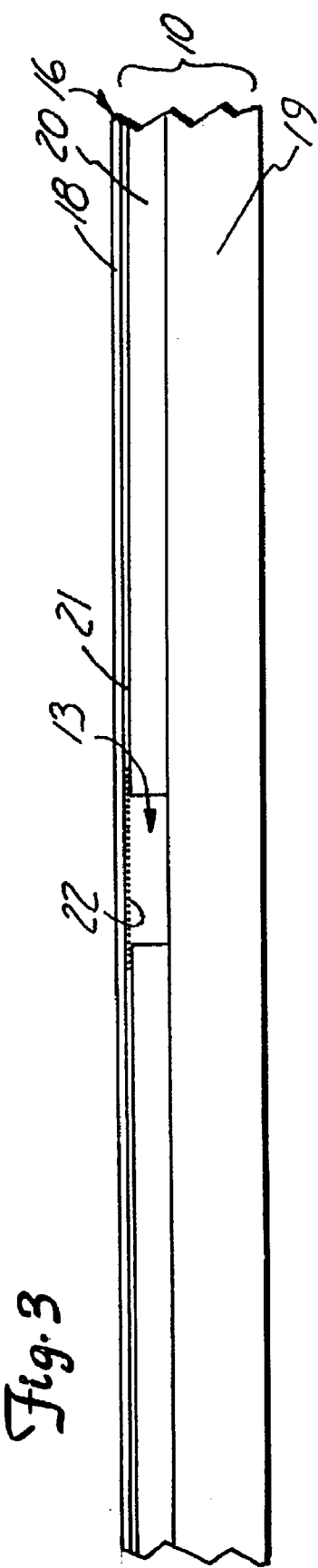
FIG. 3 is a side elevation view of another embodiment of the workpiece and buffer layer of the present invention.

It is generally desirable to place the buffer layer 16 proximate the coating or the boundary portion so that the final optical element (not shown), such as a projection lens (not shown) used in projection lithography, may be placed close to the workpiece 10. Close spacing of the final optical element (not shown) and the coating or the boundary portion may produce more favorable imaging economics and improved pattern 13 characteristics. Close spacing also limits contamination of non-imaged portions 21 of the pattern 13 located outside the pattern features. When the buffer layer 16 is in intimate contact with the coating 20, as in FIG. 2, debris 22 does not spread to the non-imaged portions 21 of the pattern 13. When the buffer layer 16 is slightly spaced apart from the coating 20, as in FIG. 3, debris 22 does spread outside the pattern feature and contaminates the non-imaged portion 21 of the pattern 13.

However, the degree of close contact desired between the buffer layer 16 and the coating 20 or the boundary portion, may also depend upon workpiece variables, such as the roughness of the coating or the boundary portion of the workpiece 10. For example, some coatings 20 have rougher surfaces than other coatings 20. It is believed that if the buffer layer 16 is in intimate contact with a rough surface such that the buffer layer conforms to the rough surface, the pattern 13 created by the energy source will likely have somewhat poorer resolution. It is believed that the poorer resolution will arise due to dispersion and diffraction effects created when the energy output passes through the buffer layer 16 at other than a substantially perpendicular orientation.

Referring back to FIG. 1, close spacing of the buffer layer 16 and the coating or the boundary portion may be obtained by laying the buffer layer 16 against the coating or the boundary portion such that the buffer layer 16 and the workpiece 10 are in fixed contact with each other. (In FIG. 1, the buffer layer 16 is shown spaced away from the workpiece 10 for purposes of clarity only.) Also, close spacing of the buffer layer 16 and the coating is inherently present when the substrate is the buffer layer 16.

Figure 4:
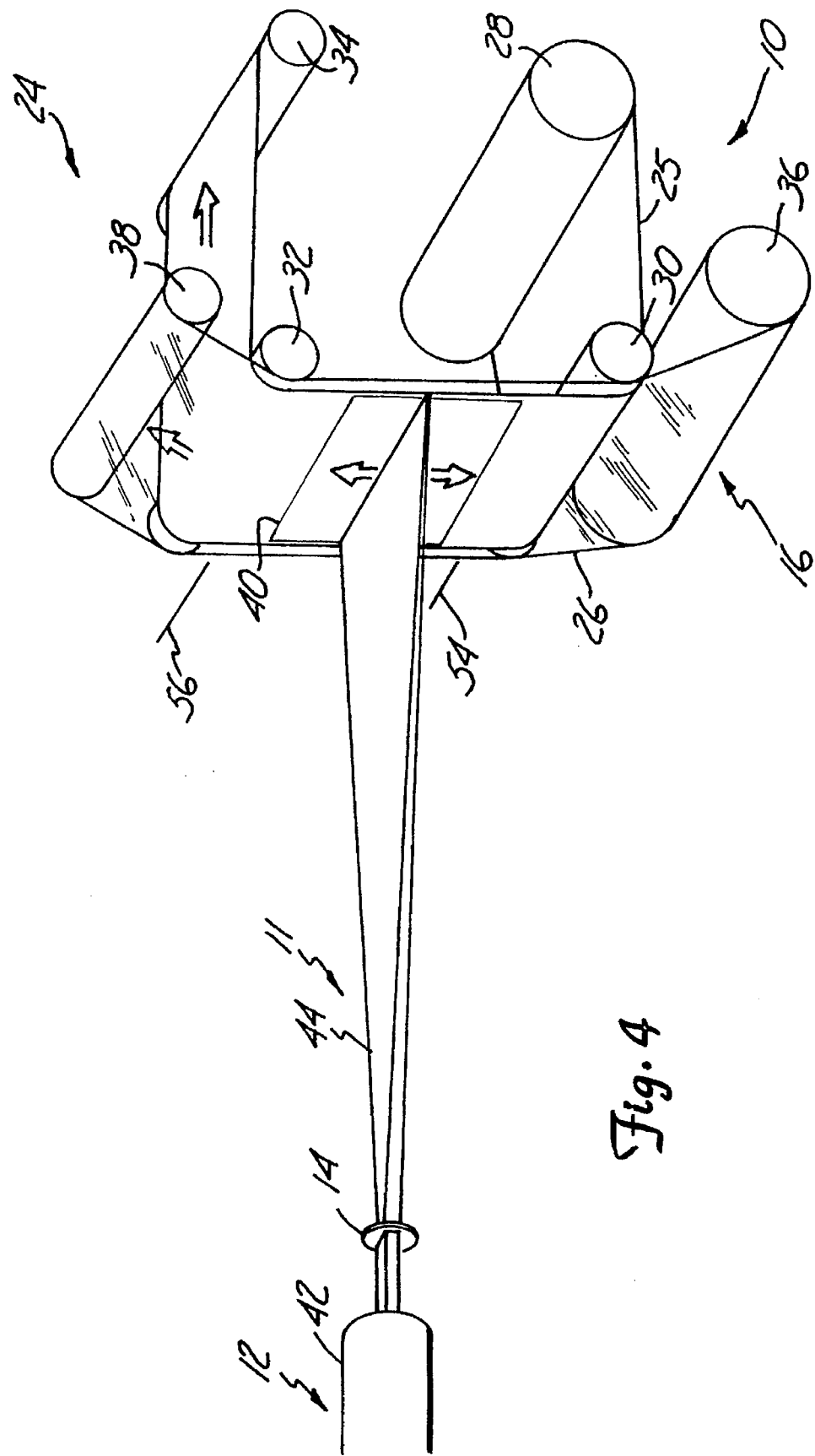
FIG. 4 is a perspective view of another embodiment of the system of the present invention.

Alternatively, as in FIG. 4, the workpiece 10 and the buffer layer 16 may be placed in dynamic relationship using a continuous staging system 24 such that the buffer layer 16 and the coating or the boundary portion of the workpiece 10 are in contact with each other, but are not fixed to each other. (For purposes of clarity only, the pattern 13 is not shown in FIG. 4.) Here, the workpiece 10 takes the form of a workpiece web 25 and the buffer layer 16 takes the form of a buffer web 26.

The workpiece web 25 extends from a supply roller 28, around two positioning rollers 30, 32, to a take-up roller 34. The buffer web 26 extends from a supply roller 36 to a take-up roller 38 such that the buffer web 26 is in contact with the workpiece web 25 between the positioning rollers 30, 32. Preferably, the workpiece web 25 and the buffer web 26 are translated in the same direction at equal linear speeds such that the workpiece web 25 and the buffer web 26 are substantially stationary with respect to each other.

Referring back to FIG. 1, a template, such as a supported mask 40 with a guide shape (not shown), may be positioned proximate the workpiece 10. The guide shape of the mask 40 comprises essentially one or more shaped windows (not shown) which direct the energy output 11 of the high energy source 12 toward the workpiece 10 in the form of the pattern 13 as the energy output 11 and the workpiece 10 move relative to each other. The workpiece 10 is located on one side of the mask 40, and the high energy source 12 is located on the other side of the mask 40. The buffer layer 16 is positioned between the mask 40 and the coating or boundary surface of the workpiece 10 to prevent debris from dispersing away from the workpiece 10 and to prevent debris from contacting the mask 40. The buffer layer 16 may also prevent debris from redepositing on areas of the workpiece 10 that are located adjacent the pattern 13 of the workpiece.

The buffer layer 16 acts as a physical, impermeable barrier that prevents movement of debris away from the workpiece 10, and thus prevents debris from contacting and soiling the mask 40. If the buffer layer 16 were not present, debris would contact and adhere to the mask 40 within the shaped windows. Cleaning of the debris from the mask 40 or replacement of the mask 40 would be needed to prevent dispersion and diffraction of the energy output 11 and undesirable imaging effects. Debris cleaning is disruptive and mask 40 replacement is expensive.

The wavelength characteristics of the high energy source 12 and the reflectivity of the mask 40 are two factors considered when selecting the mask 40. High reflectivity to the output wavelengths of the high energy source 12 is desirable outside the guide shape of the mask 40 where it is desired to block the energy output 11. High reflectivity minimizes etching of the mask 40 in areas outside the windows.

In other embodiments, the buffer layer 16 and the mask 40 are integrally connected. In one embodiment, the mask 40 is integral with any side of the buffer layer 16 such that the mask 40 is capable of guiding the energy output 11 of the high energy source 12 to form the pattern 13 in the workpiece 10. In another embodiment, the mask is formed within the buffer layer 16. The integrally connected buffer layer 16 and mask 40 are positioned proximate the coating or boundary surface of the workpiece 10 to prevent debris from dispersing away from the workpiece 10. The integrally connected buffer layer 16 and mask 40 may also prevent debris from redepositing on areas of the workpiece 10 that are located adjacent the pattern 13 of the workpiece.

In another embodiment, the template is an ink formation (not shown) placed on or proximate the coating or boundary portion of the workpiece 10. The ink formation is substituted for the mask 40. The ink formation serves as a guide for the energy output 11 of the high energy source 12 as the energy output 11 and workpiece 10 move relative to each other. The ink formation is positioned between the buffer layer 16 and the workpiece 10 if the ink formation is applied directly to the workpiece 10. Otherwise, the buffer layer 16 is positioned between the ink formation and the workpiece 10. In one embodiment, the ink formation is formed on the buffer layer 16 using known printing techniques. The ink formation may be formed on any side of the buffer layer 16 so long as the ink formation is capable of guiding the energy output 11 of the high energy source 12 to form the pattern 13 in the workpiece 10.

When used with the ink formation, the buffer layer 16 acts as a physical, impermeable barrier that prevents movement of the debris away from the workpiece 10, and thus prevents debris from contacting the final optical element (not shown). If the buffer layer 16 were not present, debris would contact and adhere to the final optical element. Cleaning of the debris from the final optical element or replacement of the final optical element would be needed to prevent dispersion and diffraction of the energy output 11 and undesirable imaging effects. Debris cleaning is disruptive and optical element replacement is expensive.

In one preferred embodiment of the inventive method, the high energy source 12 selectively removes the coating or the boundary portion in the form of the pattern 13 by a well known process called ablative decomposition, hereinafter referred to as ablation. It is known that ablation leads to high energy fragmentation of debris. It is believed that fragments of debris travel on the order of one or two centimeters from the workpiece 10. Ablation of the coating or the boundary portion may be accomplished with or without the mask 40 or ink formation.

The high energy source 12 used in the ablation process, as in FIG. 1, is preferably a laser 42 in one embodiment. The energy output 11 associated with the laser 42 is a laser beam 44. Preferably, the laser 42 is an excimer laser. The excimer laser produces a short pulse length (e.g., 20 nanoseconds) beam with sufficient energy density (approximately 0.5 J/cm$^2$) for effective ablation in the workpiece 10. Short pulses of relatively high density energy assure that a substantial amount of heat is generated in the coating or the boundary portion of the workpiece 10 in a very short time period such that the generated heat stays in the coating or the boundary portion during the short time increments of the ablation process.

The short pulse length, high density energy available from the excimer laser is believed to concentrate in the pattern of the coating or the boundary portion, rather than bleeding away from the pattern or out of the coating or boundary portion. Additionally, the high density energy of the excimer laser is available over a relatively large area, as compared to other lasers. The large beam 44 area coupled with the guide shape of the mask 40 may allow the excimer laser to desirably ablate more than one pattern or pattern feature at a time.

It has been found that a 248 nm wavelength beam from the excimer laser provides high pattern resolution and relatively high energy absorbance in some selected surface coating layers. Also, in some surface coating layers, a 308 nm wavelength beam from the excimer laser was found to produce good pattern resolution, acceptably high surface coating layer absorbance, and potentially significant operation and maintenance economies, as compared to the 248 nm UV wavelength. The 248 nm wavelength beam was obtained from the excimer laser using a mixture of krypton, fluorine, neon, and helium in a select ratio. Ultraviolet wavelength emissions of 308 nm from the excimer laser require a mixture of xenon, hydrogen chloride, neon, and helium. Proper beam geometry is an important parameter when using the excimer laser and the mask 40 in the ablation process. Particularly important beam geometry variables for the excimer laser include beam shape, beam alignment, beam focal length, and beam width and height. The emitted beam from the excimer laser is approximately rectangular in shape with about a 3:1 aspect ratio. In one embodiment, the optical elements 14 include a collimator (not shown) oriented for aligning the beam of the excimer laser. The collimator includes front surface aluminum or dielectric type mirrors with coatings appropriate for beams with selected energy densities.

Other parameters of interest when utilizing the excimer laser and the mask 40 in the ablution process are the amount of beam overlap of successive laser pulses and the amount of beam gap between successive laser pulses. It may be desirable to minimize beam overlap, while also avoiding beam gaps between successive laser pulses. Beam overlap may cause unsatisfactory ablution results, such as unwanted variations within the pattern 13, undesirable thermal effects within the workpiece 10, and detrimental changes in debris formation. Beam gap may cause incomplete formation of the pattern 13. Beam overlap and beam gap may be controlled by varying the translation speed of the beam relative to the workpiece 10. Beam overlap and beam gap may also be controlled by varying the pulse repetition rate of the excimer laser. Control of beam overlap and beam gap may depend on a variety of beam factors, such as beam focal length and beam energy density distribution profile. Beam overlap control and beam gap control may also depend on workpiece variables, such as absorption and ablation characteristics of the workpiece.

The optical elements 14 preferably include a cylindrical converging lens (not shown) and a cylindrical diverging lens (not shown). The cylindrical converging lens sets the focal length of the beam. In one embodiment of the method, the converging lens has a 42 inch (106.68 cm) focal length. The cylindrical diverging lens sets the horizontal spread of the beam emerging from the converging lens. In one embodiment of the method, the diverging lens has a 6 inch (15.24 cm) focal length. The converging and diverging lenses are made of high UV transmission materials such as fused silica, commonly known as synthetic quartz.

By adjusting the relative distances between the converging lens, the diverging lens, and the workpiece 10, the width and the height of the beam 44 are selectively adjustable to provide the desired beam energy density and the desired beam spread appropriate for particular template dimensions and workpieces. It has been found that the beam 44 of the excimer laser, with a width of approximately 200 mm and a height ranging between 0.5 mm and 4.0 mm, is particularly appropriate for use with the mask 40 for forming the pattern in the coating or the boundary portion of the workpiece 10.

Figure 5:
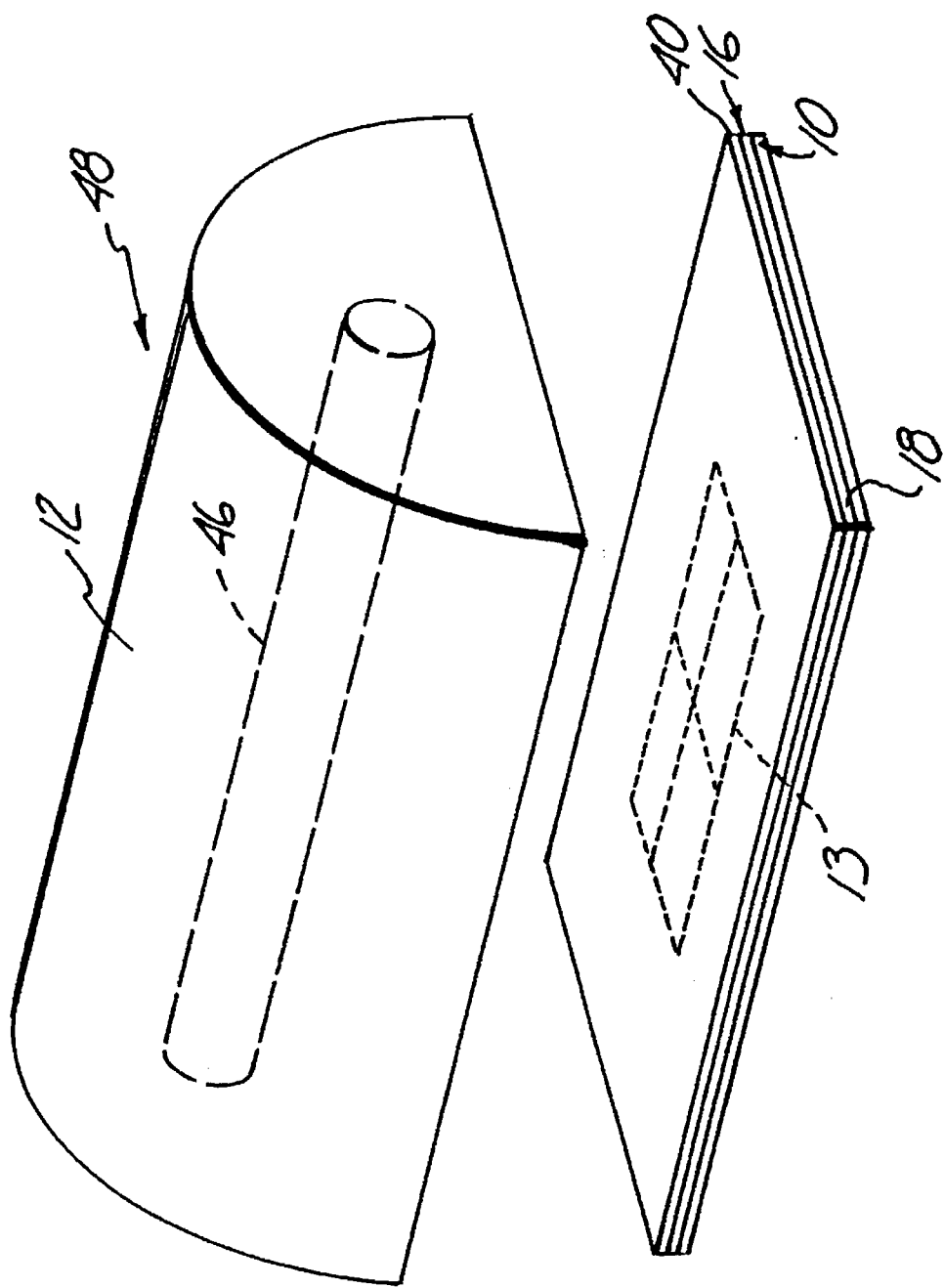
FIG. 5 is a perspective view of another embodiment of the system of the present invention.

In another embodiment, the high energy source 12 is a flashlamp 46, as in FIG. 5. Preferably, the flashlamp 46 is a short pulse linear flashlamp that includes a transparent, quartz lamp tube (not shown) with a wall thickness on the order of about 1 mm. The lamp tube has an internal bore (not shown) with a diameter in the approximate range of 3–20 mm. The length of the flashlamp 46 preferably is many centimeters, such as about 30 cm. Electrodes, preferably made of tungsten, are sealed into the ends of the lamp tube. The lamp tube is filled with a noble gas, preferably xenon for efficiency reasons.

The flashlamp 46 is pulsed in the range of 1–20 Hz by applying a high voltage in the range of 5–40 KV to the electrodes using a capacitor bank. The charge ionizes the xenon atoms to form a plasma which emits a broadband of radiation ranging from about 200 nm to about 800 nm. The flashlamp 46 includes a reflector 48 that is placed over the flashlamp 46 to shape and guide the radiation. The reflector 48 is shaped to direct the radiation, at the required density and fluence, toward the template and the coating or boundary portion of the workpiece 10.

Linear flashlamps are capable of producing high intensity, high fluence energy output at shorter wavelengths in relatively short pulses on the order of 5 μsec. Short pulses of relatively high density energy assure that a substantial amount of heat is generated in the coating or the boundary portion in a very short time period such that the generated heat stays in the coating or the boundary portion during the short time increments of imaging processes such as ablation. For example, it has been found that a xenon linear flashlamp, with a broadband spectral output provides an energy density at the template of between about 1.0 and 1.5 J/cm$^2$ during a pulse of between about 2 and 6 μsecs and is capable of suitably forming the pattern 13 in some workpieces using some templates. Additionally, the energy of the linear flashlamp is available over a relatively large area, as compared to other high energy sources. The large radiation coverage area coupled with the guide shape of the mask 40 allows the linear flashlamps to desirably create multiple patterns 13 or pattern features at a time.

Referring back to FIG. 1, the mask 40 is placed between the high energy source 12 and the workpiece 10 such that the energy output 11 ablates the pattern 13 in the coating or boundary portion of the workpiece 10. Preferably, the mask 40 is made of a base material (not shown) with high transparency to the energy output 11 of the high energy source 12, such as the ultraviolet wavelength emissions of the excimer laser. The base material of the mask 40 is coated with a protective overlay (not shown) that is highly reflective to the wavelengths of interest. In one embodiment, the base material of the mask 40 is made of synthetic fused silica, and the protective overlay is aluminum. The aluminum is preferably vacuum deposited onto the fused silica base material to a depth of approximately 600 nm. The guide shape of the mask 40 is formed in the protective overlay, the aluminum, by standard semiconductor industry photolithographic and wet etch processing techniques.

The buffer layer 16 is positioned between the mask 40 and the workpiece 10 such that the mask 40 is in close working relationship with the workpiece 10. (In FIG. 1, the mask 40, buffer layer 16, and workpiece 10 are shown spaced apart for purposes of clarity only.) In this orientation, the buffer layer 16 prevents movement of debris away from the workpiece 10 and prevents debris from contacting the mask 40. The buffer layer 16 may also prevent debris from redepositing on areas of the workpiece 10 that are located adjacent the pattern 13 of the workpiece. It is generally desirable to position the buffer layer 16 in intimate contact with both the mask 40 and the workpiece 10 to minimize spread of the beam 44 after the beam 44 passes through the mask 40. However, the desired level of intimate contact between the buffer layer 16 and the workpiece 10, as previously noted, depends upon workpiece 10 variables, such as the roughness of the coating or boundary portion.

The buffer layer 16, preferably the sheet of film, may be made of commercial grades of polymer film, such as commercial grade polypropylene and commercial grade polyethylene. However, commercial grades of polymer film are not preferred because commercial grades of polymer film typically have manufacturing defects, such as extrusion lines, surface irregularities and caliper non-uniformity. These defects introduce irregularities into the energy output 11, such as the laser beam 44, as the laser beam 44 passes through the sheet of film. Additionally, commercial grades of polymer films with these defects tend to absorb energy from the energy output 11. This causes the polymer film to heat up and decreases the durability and useful life of the polymer film.

If commercial grades of polymer films are nonetheless selected, it has been found that commercial grade polyethylene, relative to commercial grade polypropylene, is significantly less transparent to some wavelengths of interest. Correspondingly, the power supplied to the high energy source 12 for creating an identical pattern in an identical workpiece is increased for a particular source emitting a particular wavelength energy through commercial grade polyethylene, as compared to a similar source emitting the particular wavelength energy through commercial grade polypropylene.

Figure 6:
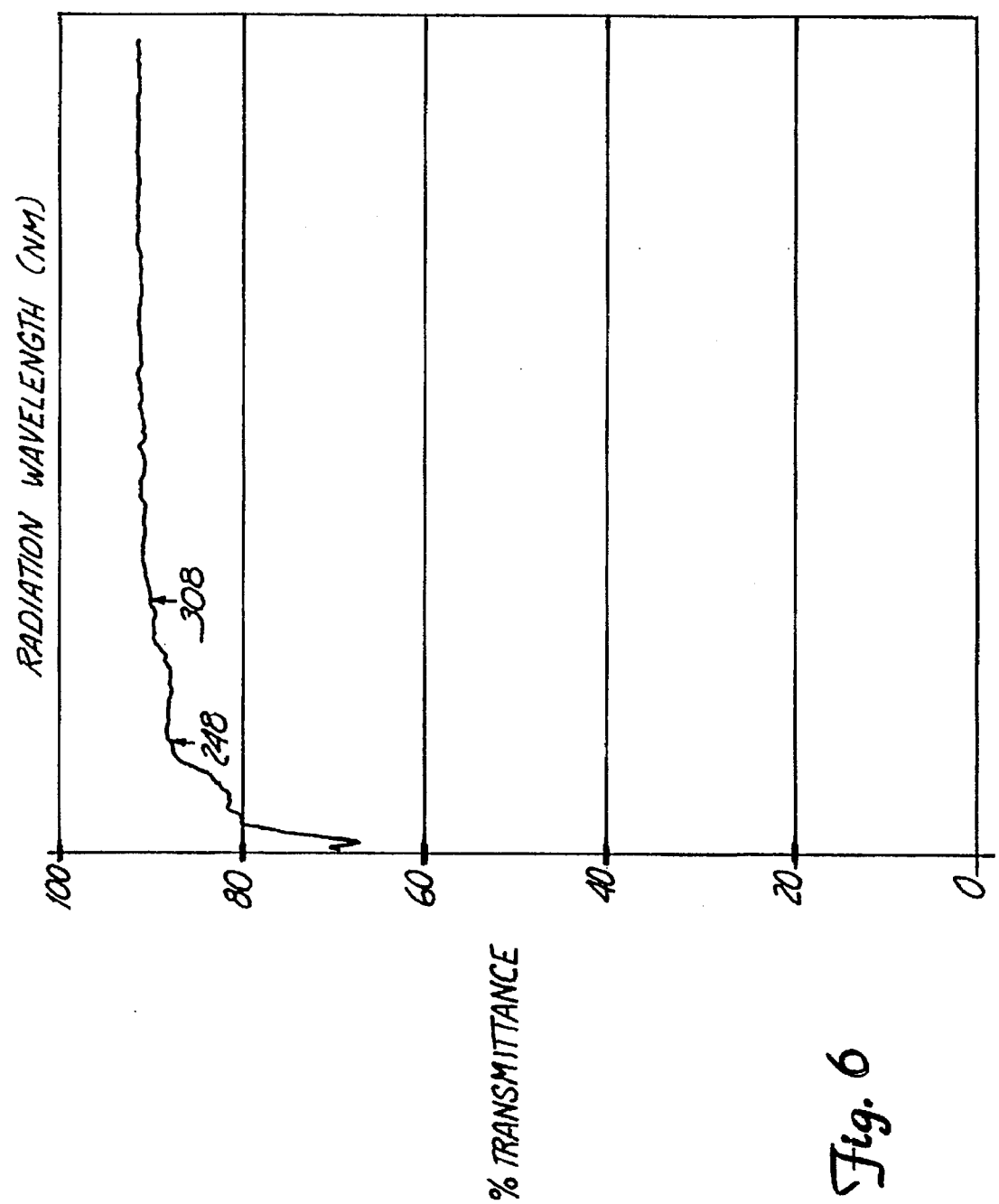
FIG. 6 is a graph of percent radiation transmittance versus a range of radiation wavelengths for a 0.001 inch (25 µm) thick sheet of capacitor grade biaxially oriented polypropylene film.

Preferably, the buffer layer 16 is made of capacitor grade biaxially-oriented polypropylene (BOPP). It has been found that capacitor grade polypropylene provides a high transmittance to 248 nm ultraviolet light, as illustrated graphically in FIG. 6. Additionally, the capacitor grade polypropylene has a smooth finish, uniform thickness, and minimal defects, such as casting marks. These qualities minimize energy output 11 absorption and spread as the energy output 11 passes through the sheet of film, thereby preserving pattern resolution and extending film life.

The buffer layer 16, preferably the sheet of film, may be positioned in relation to the workpiece 10 in a variety of ways. For instance, the sheet of film may be laid on or over the coating or boundary portion of the workpiece 10. The mask 40 may then be placed in working relation with the workpiece 10 such that the sheet of film is disposed between the mask 40 and the workpiece 10. As another example, the sheet of film may be extruded or laminated onto the coating of the workpiece 10 using conventional extrusion or lamination equipment and techniques.

Alternatively, referring to the batch staging system 23 of FIG. 1, the mask 40 may be attached to the workpiece 10 such that the workpiece 10, buffer layer 16 and mask 40 are in fixed contact, with the buffer layer 16 located between the workpiece 10 and the mask 40. (The mask, buffer layer 16, and workpiece 10 are shown spaced apart in FIG. 1 for purposes of clarity only.) The staging system 23 also includes an X-Y translation stage 52. The workpiece 10 is fixed against the translation stage 52 and the mask 40 is fixed to face away from the translation stage 52. The stage 52 is translated through the laser beam 44 to scan the energy output 11 over the guide shape of the mask 40 to ablate the pattern 13 in the workpiece 10.

Another option for positioning the buffer layer 16 includes the continuous staging system 24, as in FIG. 4, which maintains the buffer web 26 in a close, coordinated and dynamic relationship with the workpiece web 25 and the mask 40. The mask 40 is attached to a mask translation frame (not shown). A conventional programmable controller (not shown) translates the frame and the mask 40, between a starting position 54 and an ending position 56.

The mask 40 is translated in the same direction and at the same speed as the workpiece web 25 and the buffer web 26 to scan the mask 40 through the laser beam 44, between the starting and ending positions 54, 56, thereby ablating the pattern 13 in the workpiece web 25. After each pattern is completed, the mask 40 is reset to the starting position 54, the workpiece 10 and the buffer layer 16 are replaced and the mask 40 is again translated through the laser beam 44 in a repeating cycle. The continuous staging system maintains the workpiece web 25, the buffer web 26, and the mask 40 in contact and fixed relation with each other during imaging of the pattern in the workpiece, though the workpiece web 25, the buffer web 26 and the mask 40 are not fixed to each other.

Alternatively, the sheet of film may be extruded or laminated onto the coating or boundary portion of the workpiece 10 prior to the imaging process to make an imaging kit (not shown). In kit form, the sheet of film protects the coating or the boundary portion during storage and transportation of the workpiece 10. Kits may also be prepared at a centralized location to realize film placement economies.

After the pattern 13 is created in the workpiece 10, the buffer layer 16 is removed from the workpiece 10. Significant amounts of debris are typically removed with the sheet of film when the buffer layer 16 is made of biaxially-oriented polypropylene. Substrates that include the coating or the boundary portion may be cleaned of remaining debris using a conventional carbon dioxide snow blasting process. According to the snow blasting process, carbon dioxide at approximately 850 PSI (59.76 kg/cm$^2$) is mixed with ambient air to produce crystallized carbon dioxide snow granules. The crystallized snow granules are projected at the coating or the boundary portion of the workpiece 10 in "sand blast" fashion using a commercially available blasting gun.

Although many embodiments may be practiced in accordance with this invention, the invention is demonstrated by the following illustrative but non-limiting examples.

EXAMPLES

EXAMPLE 1

The batch staging system 23 of FIG. 1 is representative of the setup used in Example 1. The laser 42 was a Model LPX 315 150 Watt Excimer Laser available from Lambda Physik of Acton, Massachusetts. The Model LPX 315 laser was capable of selective beam energy output ranging from 400 to 800 mJ at up to a 150 Hz pulse rate. The Excimer Laser was optimized for fluorine and produced ultraviolet radiation with a wave length of 248 nm.

The workpiece 10 was a metal-coated substrate. The substrate was made of 25 µm thick polyethylene, and the coating was copper. The copper coating was deposited to a thickness of 100 nm by evaporating the copper onto the polyethylene substrate using a standard E-beam evaporation technique within a vacuum chamber.

The base material of the mask 40 was made of a 2.3 mm thick synthetic fused silica plate, and the base material was coated with aluminum. The aluminum was vacuum deposited on the fused silica plate to a depth of approximately 600 nm. The guide shape was formed in the mask 40 by standard semiconductor industry photolithographic and wet etch processing techniques.

The buffer layer 16 was a 50 µm thick sheet of commercial grade polypropylene. The buffer layer 16 was placed in contact with and between the mask 40 and the copper coating of the workpiece 10 by fixing the mask 40, the buffer layer 16, and the workpiece 10 to the X-Y translation stage 52.

The optical elements 14 included a cylindrical converging lens with a 42 inch (106.68 cm) focal length and a cylindrical diverging lens with a 6 inch (15.24 cm) focal length. The distances between the converging lens and the workpiece 10 and between the converging lens and the diverging lens were adjusted to provide the combination of beam width, height, and energy density required for ablation of the copper coating of the workpiece 10.

The X-Y translation stage 52 was translated through the laser beam 44 to scan the guide shape of the mask 40 to create the pattern 13 in the copper coating. The X-Y translation stage 52 was translated in the Y direction at a linear rate of 250 cm/min. The laser 42 produced an energy density of 125 mJ/cm$^2$ at the workpiece 10. The energy density was measured by an apertured Model ED-500 Joulemeter available from Gentcob of Ste-Fog, Quebec, Canada. The meter was placed the same distance from the laser 42 as existed between the laser 42 and the workpiece 10.

After the pattern 13 was ablated in the copper coating of the workpiece 10, the buffer layer 16 was removed and discarded. The buffer layer 16 prevented debris from contacting the mask 40 as the mask 40 was free of debris after the buffer layer 14 was removed. The pattern 13 formed in the copper coating had good resolution and was free of shorts between pattern features.

EXAMPLE 2

Example 2 utilized the arrangement depicted in FIG. 5. The high energy source 12 was the flashlamp 46. The flashlamp 46 was a Part No. ILCT-18 flashlamp available from ILC Technology, Inc. of Sunnyvale, Calif. The flashlamp 46 had an arc length of 8.9 cm included the quartz lamp tube with the 6 mm diameter internal bore and also included the tungsten electrodes sealed into the ends of the tube. The tube was filled with xenon gas at a gauge pressure of 400 mm of Hg(0° C.). The flashlamp 46 had a pulse width of 6 µsec FWHM with an input energy of 100 joules per pulse. The flashlamp 46 operated at a pulse repetition rate of approximately 1 Hz. Pulse radiation from the flashlamp was directed toward the workpiece 10 by the reflector 48, which was elliptically-shaped, through a 5.0 cm reflector aperture.

The workpiece 10 was the substrate coated with metal. The substrate was made of 50 µm thick polyethylene terephthalate. The coating was a 75 nm thick layer of copper that was vacuum deposited onto the polyethylene terephthalate substrate. The buffer layer 16 was a sheet of 25 µm thick capacitor grade polypropylene available from Bollmet Industries of Dayville, Conn. The mask 40 was substantially similar to the mask 40 described in Example 1. Radiation from the flashlamp 46 was directed through the mask 40 and through the buffer layer 16 to ablate the pattern 13 in the coating of the workpiece 10. Radiation from the flashlamp 46 ablated approximately 14 cm$^2$ area of copper from the polyethylene terephthalate substrate. The buffer layer 16 was removed and discarded after imaging of the pattern 13 in the workpiece 10. The resolution of the pattern 13 was good with no shorts between pattern features. The pattern features included lines as small as 100 µm wide with 50 µm line to line spacing.

EXAMPLE 3

Figure 7:
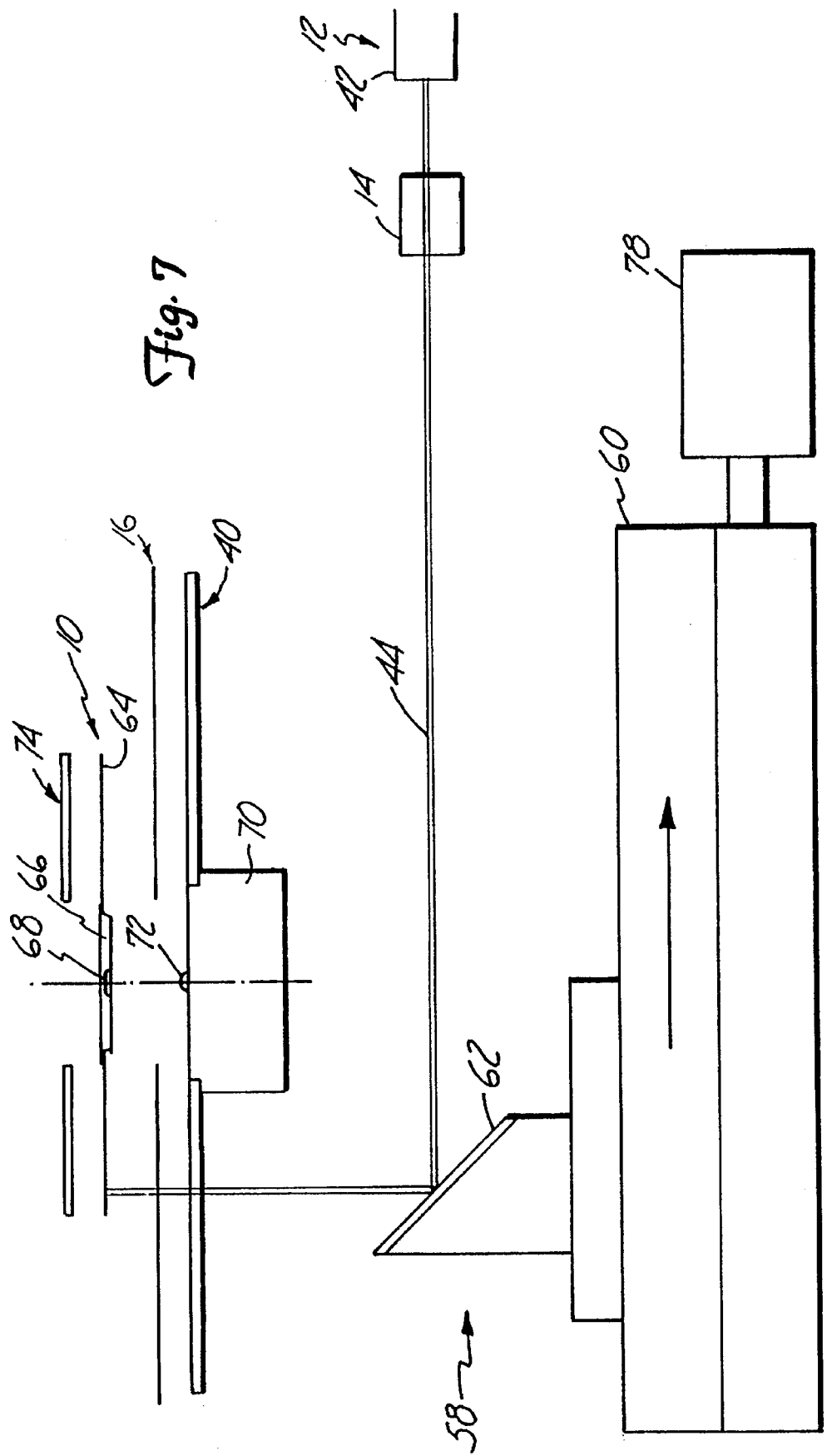
FIG. 7 is a side elevation view of another embodiment of the system of the present invention.

For this Example, a translating mirror set-up 58, illustrated in FIG. 7, was utilized. The translating mirror set-up 58 included the workpiece 10, the buffer layer 16, the mask 40, and the laser 42. Additionally, the translating mirror set-up 58 included a linear translation stage/servo 60 with a flat mirror 62 mounted on the stage/servo 60 such that the laser beam 44 of the laser 42 was directed through the mask 40 and the buffer layer 16 to create the pattern 13 in the workpiece 10.

The laser 42 was the Model LPX 315 Lambda Physik Excimer Laser described in Example 1. The optical elements 14 comprised the cylindrical converging lens and the cylindrical diverging lens of Example 1 arranged as described in Example 1.

The workpiece 10 of this Example was a nominal 3.5 inch (8.89 cm) magnetic data storage disk, generally referred to as a floppy disk 64. The floppy disk 64 was made of a polyethylene terephthalate substrate layered with a magnetic coating consisting of magnetic particles dispersed within a 0.7 µm polymeric binder. The buffer layer 16 was made of capacitor grade biaxially oriented polypropylene film available from Bollmet Industries of Dayville, Conn. The buffer layer 16 was 0.001 inches (25 µm) thick and, referring to FIG. 6, had a transmittance of about eighty-two percent (82%) to 248 nm radiation. Transmission was measured using a Model Lambda-9 UV/Vis Spectrophotometer available from Perkin Elmer Co. of Eden Prairie, Minn.

The mask 40 was substantially similar to the mask 40 described in Example 1. In addition, the guide shape of the mask 40 was capable of use in forming the pattern 13 in the magnetic coating of the floppy disk 64. The pattern 13 included a plurality of concentric optical servo tracks. Each servo track included a plurality of stitches arranged end to end in single file fashion. Each stitch was approximately 5 µm wide and between about 40 to 80 µm long. Overall, the pattern 13 included approximately 1.5 million stitches.

The floppy disk 64 included a standard central hub portion 66 with a central locating feature 68. A mask centering hub 70 with a centering pin 72 was attached to the center of the mask 40.

The buffer layer 16 was then placed onto the mask 40 such that the buffer layer 16 fully covered the guide shape of the mask 40. The floppy disk 64 was then placed onto the mask 40 such that the buffer layer 16 was disposed between the mask 40 and the floppy disk 64. The floppy disk 64 was precisely aligned to the guide shape of the mask 40 using the central locating feature 68 and the mask centering hub 70. A weighted contact mat 74 was then placed on the floppy disk 64 to minimize disk 64 distortion and assure intimate contact between the floppy disk 64 and the buffer layer 16 and between the buffer layer 16 and the mask 40. (The mask 40, buffer layer 16, floppy disk 64, and contact mat 74 are shown spaced apart in FIG. 7 for purposes of clarity only.)

The mask 40, the buffer layer 16, and the floppy disk 64 were fixed relative to the linear translation stage/servo 60 such that the laser beam 44 emerging from the diverging lens of the optical elements 14 reflected off the flat mirror 62 and scanned the guide shape of the mask 40 to form the pattern 13 of optical servo tracks in the magnetic coating of the workpiece 10 as the stage/servo 60 moved. A standard programmable controller in combination with a DC servo motor 78 directed linear movement of the stage/servo 60, and thus the flat mirror 62, with respect to the mask 40 at a rate of approximately one hundred inches per minute (254 cm/minute).

The laser 42 produced an energy density of approximately 125 mJ/cm$^2$ at a pulse repetition rate of 140 Hz. After ablation was completed, the buffer layer 16 was removed. The magnetic coating was then cleaned using the carbon dioxide snowblasting process at a carbon dioxide pressure of approximately 850 PSI (59.76 kg/cm$^2$). Atomic Force Microscope (AFM) measurements showed minimal diffraction effects were created in the pattern 13 of optical servo tracks due to the buffer layer 16 or the mask 40. Several hundred floppy disks 64 were successfully imaged without any indication of degradation of the guide shape of the mask 40. Significant amounts of debris were evident on the buffer layers 16 after respective buffer layers 16 were separated from respective floppy disks 64.

EXAMPLE 4

The batch staging system 23 of FIG. 1 was utilized in Example 4. The details about the laser 42 and the optical elements 14 were substantially similar to those described in Example 1. Multiple workpieces with differing patterns 13 formed in the coating in each respective workpiece 10 utilizing different buffer layers 16 at different laser pulse repetition rates and different X-Y translation stage 52 translation speeds were included in the work of Example 4, as summarized in the following table:

| Workpiece 10 (Coating 20\ Substrate 19) | Pattern 13 | Buffer Layer 16 | Pulse (Hz) | Translation Speed (cm/ minute) |
|---|---|---|---|---|
| 100 nm Nickel/50 µm Polyester | Grid of 12 µm lines on 250 µm centers | 50 µm commercial grade polypropylene | 50 | 203.2 |
| 100 nm Nickel/25 µm Polyethylene | Grid of 12 µm lines on 250 µm centers | Same | 45 | Same |
| 100 nm Nickel/175 µm Polycarbonate | Parallel 12 µm wide lines on 500 µm centers | Same | 45 | Same |
| 100 nm Copper/ 25 µm Polyethylene | Grid of 12 µm lines on 250 µm centers | Same | 40 | Same |
| 150 nm Copper/ 175 µm Polycarbonate | Parallel 12 µm wide lines on 500 µm centers | Same | 45 | Same |
| 100 nm Chromium/ 50 µm Polyester | Grid of 12 µm lines on 250 µm centers | Same | 45 | Same |
| 50 µm Polyester (no coating) | Memory Card Circuit | 25 µm capacitor grade polypropylene | 75 | 254 |

The laser 42 supplied an energy density of approximately 125 mJ/cm$^2$ to the coatings of the respective workpieces 10 to form the respective patterns 13 in the respective coatings or boundary portion. After each pattern 13 was formed, the buffer layer 16 was removed and the pattern 13 of the respective workpiece 10 was inspected. Though pattern quality varied among the respective workpieces 10, the laser 42 satisfactorily formed each of the patterns 13 in the respective coatings and boundary 30 portion of the workpieces 10.

EXAMPLE 5

The batch staging system 23 of FIG. 1 was utilized in Example 5. The laser 42, the optical elements 14, the workpiece 10, the buffer layer 16, and the mask 40 were as described in Example 1. The pattern 13 formed in the coating of the workpiece 10 was a grid of 12 µm wide lines on 250 µm centers. The pattern 13 was formed in the workpiece 10, as described in Example 1, in over 150 samples of the workpiece 10 using the same mask 40. The mask 40 required no special handling other then periodic cleaning with Texwipes® and isopropyl alcohol. In each of the 150 samples, the pattern 13 formed in the workpiece 10 had good resolution.

If the buffer layer 16 had not been used, the life expectancy of the mask 40 would have been approximately 10 samples. Instead, use of the buffer layer 16 allowed use of the mask 40 on 150 samples to date, without significant degradation of the guide shape of the mask 40, and is expected to allow continued use of the mask 40 on additional samples of the workpiece 10 in the future.

Although the present invention has been described with reference to preferred embodiments, workers skilled in the art will recognize that changes may be made in form and detail without departing from the spirit and scope of the invention.

What is claimed is:

1. A system for prolonging the useful life of a mask while ablating a pattern into a workpiece, comprising:

a workpiece;

a debris-blocking layer, in contact with the workpiece, which is substantially transparent to ultraviolet radiation;

a mask in contact with a side of the debris-blocking layer opposite the workpiece;

means for positioning the debris-blocking layer in contact with the workpiece and for positioning the mask in contact with the debris-blocking layer;

means for separating the debris-blocking layer and mask from the workpiece; and a high energy source of ultraviolet radiation capable of ablating the workpiece;

whereby a pattern corresponding to the mask may be ablated into the workpiece by the high energy source while the debris-blocking layer minimizes degradation of the mask, thereby minimizing the need to clean the mask and prolonging the useful life of the mask.

2. The system of claim 1, wherein the ultraviolet radiation has a wavelength within the range from about 248 to 308 nm.

3. The system of claim 2, wherein the high energy source is a laser.

4. The system of claim 2, wherein the high energy source is a flashlamp.

5. The system of claim 1, wherein the debris-blocking layer comprises a commercial grade polymer film.

6. The system of claim 1, wherein the debris-blocking layer comprises one of polypropylene, polyethylene, polycarbonate, and polymethymethacrylate.

7. The system of claim 1, wherein the debris-blocking layer comprises commercial grade polypropylene.

8. The system of claim 1, wherein the debris-blocking layer comprises capacitor grade biaxially oriented polypropylene.

9. The system of claim 1, wherein the workpiece is a data storage disk comprising a substrate coated with a magnetic coating, wherein the high energy source is capable of ablating the coating, and wherein the pattern comprises a plurality of optical servo tracks.

10. A system for prolonging the useful life of a mask while ablating optical servo tracks into a magnetic data storage disk, comprising:

a magnetic data storage disk comprising a substrate coated with a magnetic coating;

a debris-blocking layer, in contact with the magnetic coating, which is substantially transparent to ultraviolet radiation;

a mask in contact with a side of the debris-blocking layer opposite the disk; means for positioning the debris-blocking layer in contact with the disk and for positioning the mask in contact with the debris-blocking layer;

means for separating the debris-blocking layer and mask from the disk; and an ultraviolet laser;

whereby a plurality of optical servo tracks may be ablated into the data storage disk by the laser while the debris-blocking layer minimizes degradation of the mask, thereby minimizing the need to clean the mask and prolonging the useful life of the mask.

11. The system of claim 10, wherein the ultraviolet radiation has a wavelength within the range from about 248 to 308 nm.

12. The system of claim 10, wherein the debris-blocking layer comprises a commercial grade polymer film.

13. The system of claim 10, wherein the debris-blocking layer comprises one of polypropylene, polyethylene, polycarbonate, and polymethymethacrylate.

14. The system of claim 10, wherein the debris-blocking layer comprises commercial grade polypropylene.

15. The system of claim 10, wherein the debris-blocking layer comprises capacitor grade biaxially oriented polypropylene.

16. The system of claim 10, wherein the optical servo tracks comprise a plurality of stitches spaced in single file, end-to-end fashion, each stitch being less than about 10 μm wide.

* * * * *